United States Patent [19]
Thompson, Sr.

[11] Patent Number: 6,145,729
[45] Date of Patent: Nov. 14, 2000

[54] NON-CONNECTED DRAINAGE CHANNELS FOR SELECTIVE WAVE SOLDER PALLETS

[75] Inventor: Curtis C. Thompson, Sr., Meridian, Id.

[73] Assignee: MCMS, Inc., Nampa, Id.

[21] Appl. No.: 09/099,278

[22] Filed: Jun. 18, 1998

[51] Int. Cl.$^7$ ................................ B23K 1/08; B05C 3/02
[52] U.S. Cl. ......................... 228/39; 228/21; 228/180.1; 228/37; 118/406
[58] Field of Search ................................. 228/37, 39, 57, 228/118, 214, 180.1; 438/26, 51, 55, 64, 106

[56] References Cited

U.S. PATENT DOCUMENTS

| | | | |
|---|---|---|---|
| 5,121,869 | 6/1992 | Knudsen, et al. | 228/4.1 |
| 5,454,505 | 10/1995 | Kearns | 228/39 |
| 5,617,990 | 4/1997 | Thompson, Sr. | 228/180.1 |

*Primary Examiner*—Patrick Ryan
*Assistant Examiner*—Colben P. Cook
*Attorney, Agent, or Firm*—Knobbe, Martens, Olson & Bear, LLP

[57] ABSTRACT

A wave solder pallet having a first side that is adapted to receive a printed circuit board and a plurality of through holes or apertures that will allow solder to be transmitted through to selected regions on the printed circuit board. The surface of the base plate that is positioned adjacent the solder wave has channels formed therein, the channels being tapered inwardly so that the overall volume of the channel is greatest at the periphery of the pallet. The increased volume of the channel reduces the pressure effect of the solder wave as it contacts the pallet at the periphery thereby reducing the amount of solder that is splashed over the pallet. The tapering of the channel uniformly increases the pressure so that the pressure effect of the solder wave is increased when it travels through the apertures. Moreover, at a location adjacent the through holes, the surface of the pallet is closer to the solder wave than at some other locations, so as to increase the pressure effect of the solder wave within the adjacent aperture.

11 Claims, 3 Drawing Sheets

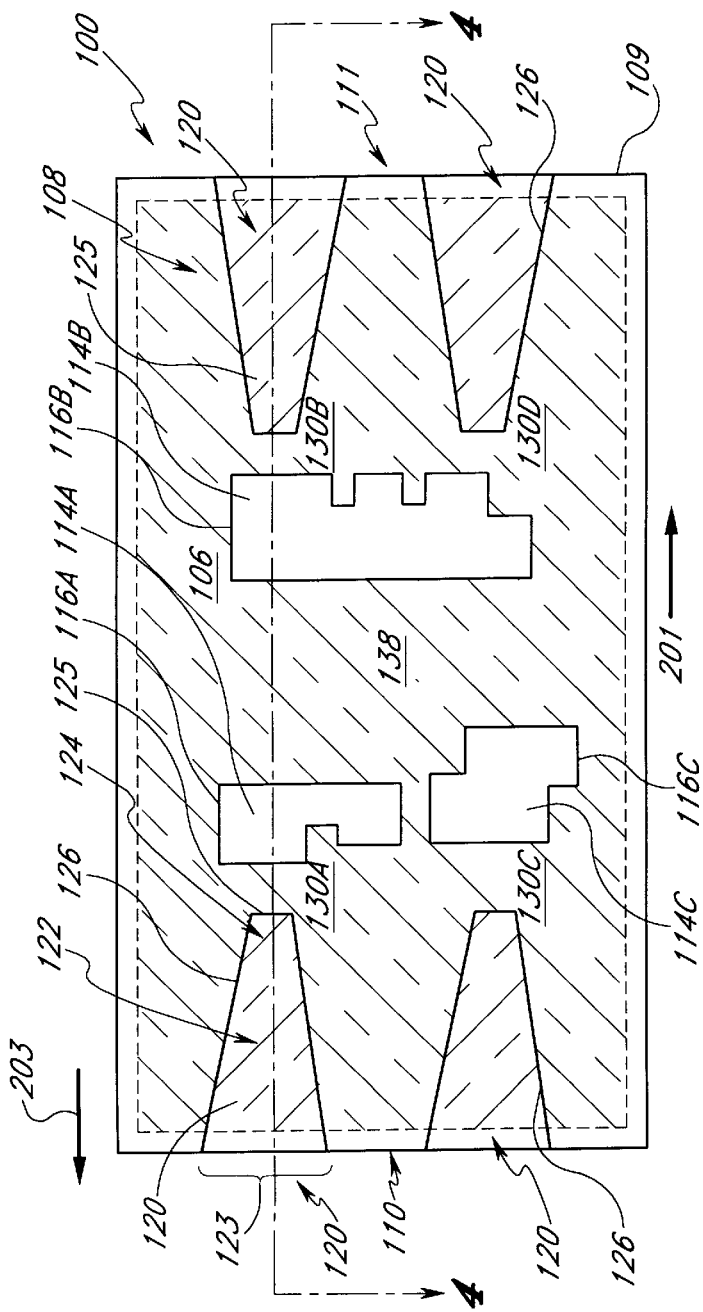
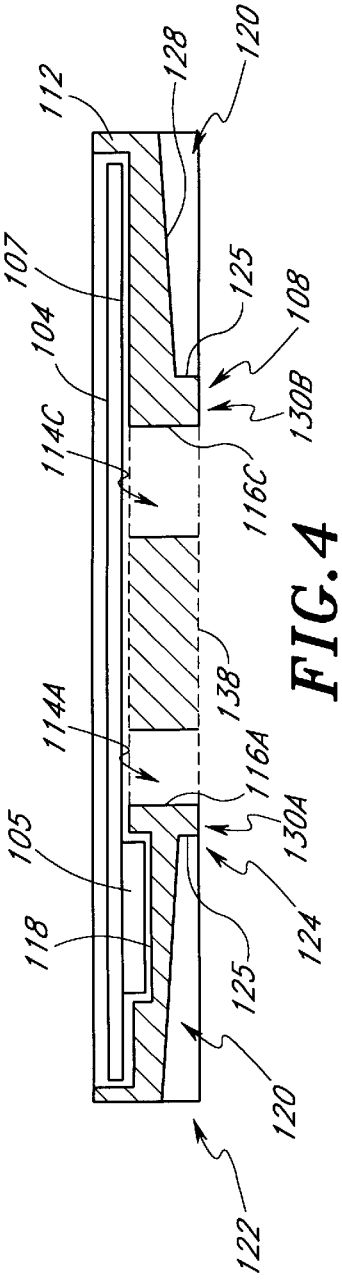
FIG.3
FIG.4

NON-CONNECTED DRAINAGE CHANNELS FOR SELECTIVE WAVE SOLDER PALLETS

BACKGROUND OF THE INVENTION

1. Field of the Invention

The invention relates to a device for applying solder to a workpiece and more particularly to an apparatus for wave solder treatment of printed circuit boards.

2. Description of the Related Art

Most electronic devices use a circuit board as the fundamental building block for the electronic circuitry which forms the device. With the advent of the printed circuit board (PCB), the board itself actually became part of the circuit, forming conductors for the electrical current between the various electronic components. The circuit board both supports the electronic components and links the components together. Generally, the printed circuit board consists of a non-conductive base, such as fiberglass, coated with a thin layer of a conductor, such as copper, which is etched to form a pattern of electrical conductors. Further advances in PCB technology have resulted in dual sided PCBs, configured so that components are attached on both sides of the boards, and in multilayered PCBs having layers of conductors buried in the non-conductive substrate, which allow intricate and complex circuits to be implemented in a smaller area.

One technique used for soldering the various electronic components to a circuit board substrate is wave soldering. Wave soldering is a continuous process in which circuit boards are positioned in a solder pallet having a solder pattern. The PCB boards positioned in the pallet are then passed over a standing wave of molten solder and the pattern is configured so as to allow molten solder to flow over the regions of the PCB board that are to be soldered. Specifically, the pallet includes apertures which correspond to the areas of the circuit board on which solder is to be deposited and recesses on top of the pallet to house and protect components which would otherwise be exposed to the solder.

In general, solder pallets have a flat bottom surface with the apertures formed in the inner regions of the pallet. During the wave soldering process, the solder wave, which has a constant pressure, is directed towards the flat bottom surface of the solder pallet and the pallet and PCB board assembly is moved relative the wave solder source so that the solder wave travels across the bottom surface of the pallet and wicks up through the apertures containing the components leads to solder the component leads to the PCB board.

When using a solder pallet, the solder wave needs to be tall enough (i.e., pressured enough) so as to wick up through the apertures to make contact with the component leads and the board to result in acceptable soldering of the components leads. However, the solder wave may be pressurized at a level such that when it contacts the flat bottom of the pallet, a large amount of solder can overflow or splash outside of the perimeter of the solder pallet and can even splash over the solder machine or sides of the pallet. This splashed solder can solidify on the solder machine or the pallet and cause machine down times for cleaning, which adds to manufacturing cost.

One prior art solution to this problem is to cut continuous channels in the bottom of the solder pallet to reduce the pressure of the solder wave impacting the bottom surface of the pallet. Specifically, in the prior art, uniform channels are cut from the edge of the apertures to the outside edge of the pallet to reduce the pressure of the solder wave by releasing the solder gases and draining the excess solder. However, this method is not efficient. Since the apertures are connected to the continuous channels, the regions to be soldered on the PCB also experience a reduction in solder flow pressure. The channel effectively reduces the pressure all the way along the path of the solder wave, thereby reducing overflow or splashing adjacent the perimeter of the solder pallet but at a cost of also reducing the pressure at the location of the apertures. In many applications, this results in poor solder connections at the location of the apertures since the reduction in the pressure of the wave at the aperture causes less solder to reach the component leads.

Hence, there is a need for a wave solder pallet which allows for adequate soldering of the component leads but otherwise reduces the quantity of solder that overflows or splashes about the periphery of the solder pallet during the wave soldering process.

SUMMARY OF THE INVENTION

The aforementioned needs are satisfied by the device of this invention which comprises a wave solder pallet having a first side that is adapted to receive a printed circuit board and a plurality of through holes or apertures that will allow solder to be transmitted therethrough to selected regions on the printed circuit board.

In one embodiment, a wave solder pallet for wave soldering a selected area of a printed circuit board is provided. The solder pallet includes a base plate having a first and a second side. The base plate is adapted to receive a printed circuit board on the first side and has at least one aperture extending from the first side to the second side so as to allow solder from a wave solder system to flow thorough the aperture and contact the selected region of the printed circuit board when the base plate is drawn across a solder wave in a first direction. Further, the base plate also has at least one channel that extends from an outer periphery of the base plate in the first direction towards an inner end located adjacent the aperture. The volume of the channel at the outer periphery is greater than the volume of the channel at the inner end so that the pressure of the solder wave at the outer periphery of the base plate is less than the pressure of the solder wave at the inner end.

In another aspect of the invention, a process of wave soldering a printed circuit board is provided. The process comprises positioning a printed circuit board on a pallet having at least one aperture extending therethrough so that a portion of the printed circuit board to be soldered is positioned adjacent the aperture, directing a solder wave towards a first region of the pallet wherein the first region is located at a first depth on the pallet such that the first region reduces the pressure of the solder wave that contacts the pallet, producing a reduced pressure solder wave contacting the pallet at the first region. The method further comprises directing the reduces pressure solder wave towards a second region of the pallet wherein the second region is located at a second depth on the pallet such that the second region increases he pressure of the reduces pressure solder wave, producing an increased pressure solder wave contacting the pallet at the second region and wherein the second region is interposed between the first region and the aperture. The method further comprises directing the increased pressure solder wave towards the aperture so that a portion of the increased pressure solder wave is introduced into the aperture.

These and other objects and advantages will become more apparent from the following description taken in conjunction with the accompanying drawings.

BRIEF DESCRIPTION OF THE DRAWINGS

FIG. 3 is a top plan view of the wave solder pallet of FIG. 1;

FIG. 4 is a cross-sectional elevational view of the wave solder pallet of FIG. 3 taken along the lines 4—4 in FIG. 3.

DETAILED DESCRIPTION OF THE INVENTION

Figure 1:
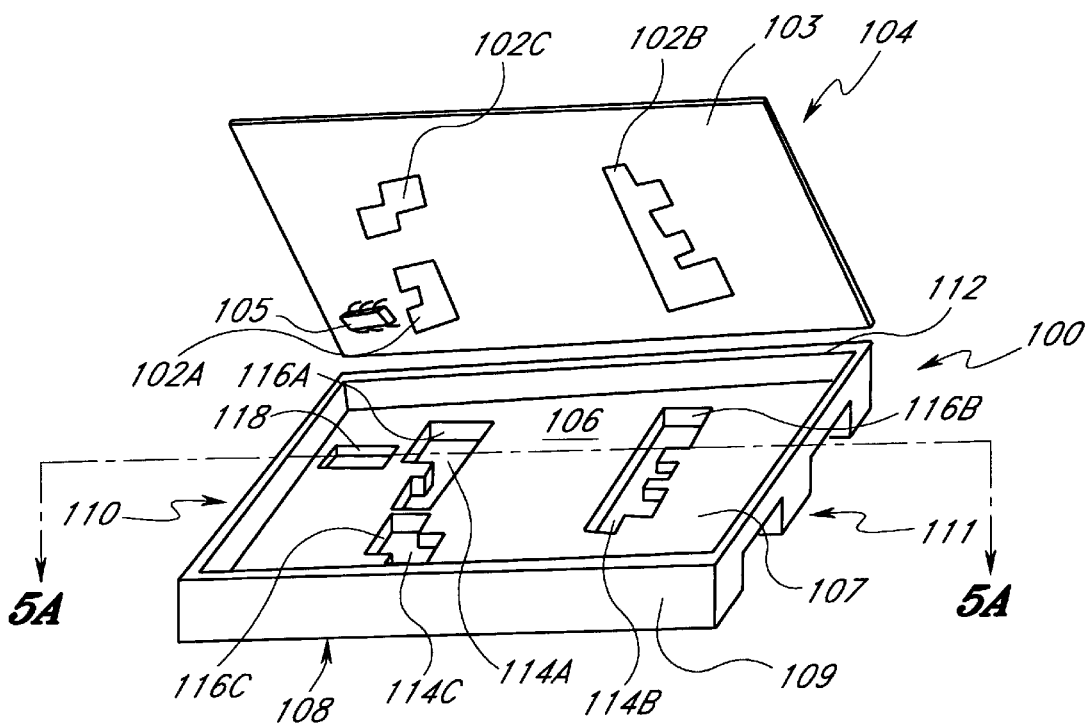
FIG. 1 is a perspective view of one embodiment of a wave solder pallet.

Reference will now be made to the drawings wherein like numerals refer to like parts throughout. FIG. 1 shows a solder pallet 100 for use in a wave soldering process to selectively apply solder onto selected areas 102A, 102B and 102C of a solder side 103 of an exemplary circuit board 104. The circuit board 104 may also have one or more components 105 which are positioned on the solder side 103 of the circuit board 104.

In this embodiment, the solder pallet 100 may comprise a base plate 106 of a generally rectangular configuration having an upper side 107, a lower side 108, a peripheral wall 109, a forward-end 110 and a rear-end 111. The lower side 108 of the pallet 100 may comprise a flat surface.

A peripheral lip 112 may be peripherally attached or otherwise formed on the upper side 107 of the base plate 106. The peripheral lip 112 is provided for holding the circuit board 104 in a fixed position against the upper side 107 of the base plate 106 during the soldering process. In this respect, the peripheral lip 112 is sized and shaped to closely receive the peripheral edges of the circuit board 104 so as to prevent the circuit board 104 from moving during the soldering process. At this point, it will be appreciated that various devices, such as clamps or similar fastening devices (not shown), can optionally be used to secure the circuit board 104 to the solder pallet 100.

In this embodiment, the base plate 106, for example, includes apertures 114A, 114B and 114C which are formed through the base plate 106 extending from the upper side 107 to lower side 108. The apertures 114A, 114B and 114C are defined by aperture peripheral edges 116A, 116B and 116C which are sized and shaped with respect to the selected areas 102A, 102B and 102C on the printed circuit board 104 so that solder can wick through the apertures 114A–114C and be applied to the selected areas 102A–102C of the circuit board 104 in the manner that will be described in greater detail hereinbelow. It will be understood that the selected areas 102A, 102B and 102C of the circuit board 104 are exposed to solder via the corresponding apertures 114A, 114B and 114C during the wave soldering process (ie., the aperture 114A exposes the selected area 102A and so on). In this embodiment, aperture peripheral edges 116A, 116B and 116C may be perpendicular to the planes of the upper and lower sides 107 and 108 of the base plate 106.

Additionally, one or more recessed areas 118 may be provided on the upper side 107 of the base plate 106 to receive and shield components 105 that have already been positioned on the circuit board 104 during the board assembly process. The depth of the recess 118 is generally slightly greater than the height of the components 105.

In this embodiment, the base plate 100 may be made from a heat and solder resistant material such as DELMAT which is available from Von Roll Isola, Inc., Rutland, Vt. DELMAT is a composite material which is machinable and maintains its mechanical properties at soldering temperatures. DELMAT is also resistant to solder and has a low thermal conductivity of approximately $3 \times 10^{-6}$ W/cm K which makes it a good thermal shield. An electrostatic dissipative version of this material is CDM-ESD 68.610 which is suitable for electrostatic discharge sensitive applications and is available from the same manufacturer.

Figure 2:
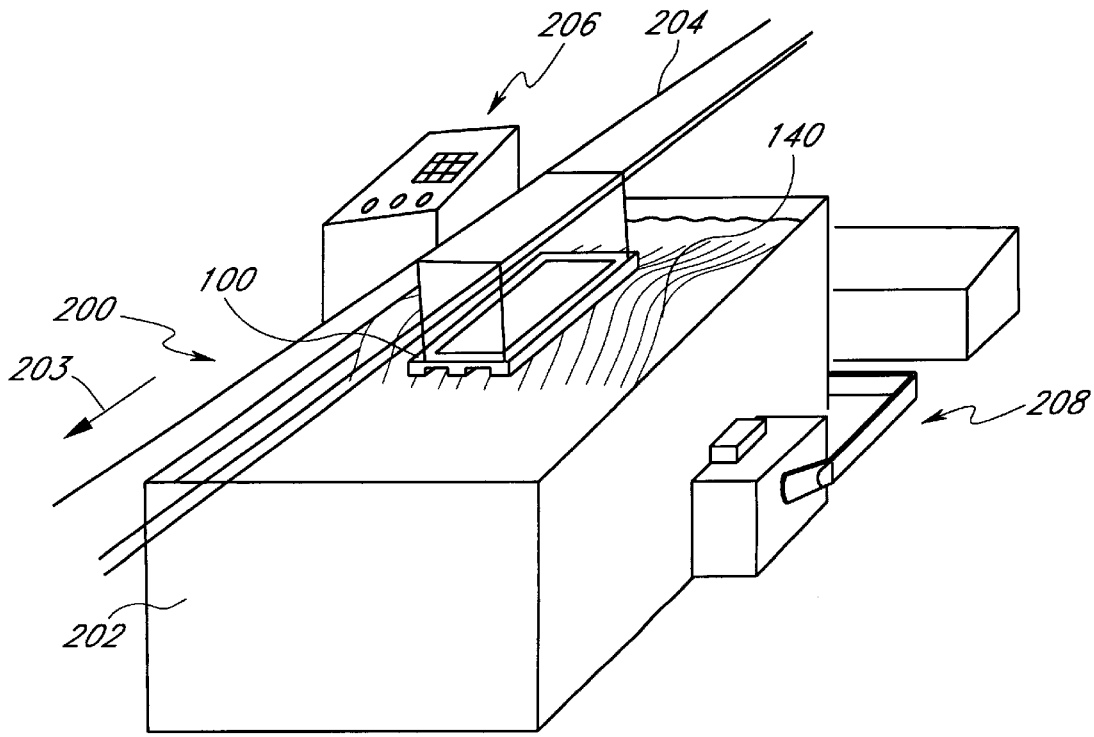
FIG. 2 is a perspective view of a wave soldering assembly incorporating the wave solder pallet of FIG. 1.

FIG. 2 shows an exemplary wave solder system 200 which comprises a solder reservoir 202, a pallet transportation mechanism 204, control equipment 206 and operation equipment 208. The solder reservoir 202 is the place where the solder is maintained at its melting temperature and where the solder wave 140 (also see FIGS. 5A–5C) is created. The wave solder system 200 may include a nozzle 142 (see FIGS. 5A–5C) to form the solder wave when the molten solder is forced out through the nozzle 142 by a pumping system (not shown) of the wave solder system 200 in a manner known in the art. The transportation mechanism 204 may comprise a conveyor system that moves the pallet 100 with the circuit board 104 in a first direction 203 through the solder wave 140 (see FIGS. 5A–5C). As shown in FIG. 2, the solder wave 140 extends in a direction that is perpendicular to the first direction 203 so that the entire width of the solder pallet 100 is passed through the wave. As is further understood in the art, the solder system 200 produces a solder wave 140 that is of substantially uniform pressure along the entire length of the solder wave 140. The operation of the wave solder system 200 is substantially the same as commonly available wave solder systems of the prior art.

As illustrated in FIGS. 3 and 4, the lower side 108 of the base plate 106 of the pallet 100 may include a plurality of channels 120 which may have a uniformly tapered configuration such that the channels 120 uniformly taper inward toward the center of the pallet 100 from a wider first end 122, positioned adjacent the peripheral edge of the base plate 106, to a narrower second end 124. In this embodiment, the first end 122 may comprise an opening 123 while the second end may 124 may comprise an end-wall 125.

As shown in FIG. 3, the lower side 108 of the base plate 106 of the illustrated embodiment, may comprise four identical channels 120 extending from either end 110 and 111 of the base plate 106 towards a centrally located transverse axis. Accordingly, either end 110 and 111 of the base plate 100 may comprise two of the channels 120. Further, the channels 120 may be symmetrically aligned along a centrally located X-lateral axis in the manner shown in FIG. 3.

Each of the channels 120 may be defined by channel side-walls 126 and a channel ceiling 128. The channel side walls 126 extend perpendicular to the plane of the lower side of the base plate 100 and terminate at the end-wall 125 of the channel 120. In this respect, the upper end of the channel side walls 126 adjoin the channel ceiling 128 which may uniformly decline towards the end wall 125 at an angle, in the manner shown in FIG. 3. In this embodiment, it will be understood that the combined effect of the tapered side walls and the declining ceiling 128 results in the volume of the channels 120 decreasing in the direction of the end wall 125. As will be explained below, this configuration of channels 120 reduces the solder splashing on the flat portion of the lower side 108 of the base plate 106.

As shown in FIGS. 3 and 4, the channels 120 in this embodiment may be configured such that the channels 120 are separated from the apertures 114A, 114B and 114C by a number of base plate segments, namely a first, a second, a third and a fourth base plate segment 130A–130D. For example, referring to FIG. 3, the first base plate segment 130A may be located between a portion of the side-wall 116A of the aperture 114A and the end-wall 125 of the corresponding channel 120. Similarly, the second, third and fourth base plate segments 130B–130C and 130D are located in the manner shown in FIG. 3.

The base plate segments 130A–130D in this embodiment are co-planar with the bottom surface of the base plate 106. Consequently, the pressure of the solder wave 140 when it contacts the base plate segments 130A–130D which defined pressure increasing surfaces is suddenly increased, as the base plate 106 is moved in the first direction (represented by the arrow 203 in FIG. 3) by the conveyer system 204 just prior to the solder wave 140 entering the apertures 114B and 114D. This results in the pressure of the portion of the solder wave 140 entering the aperture 114A–114D being increased which improves the distribution of solder on the regions 102A–102C of the circuit board 104 that are to be soldered. The size of the channels 120 is dependent upon the amount of solder.

As shown in FIGS. 3–4, in this embodiment an intermediate base plate segment 138 may extend between the apertures 114A–114C and is further designed to be co-planar with the bottom surface 108 of the base plate 106 so as to increase the pressure of solder entering the apertures 114A–114C. As will be explained more fully below, the base plate segments 130A–130D dam the channels 120 and prevent direct fluid communication between the apertures 114A–114C and the corresponding channels 120. The use of the solder pallet 100 of this embodiment will be explained in greater detail with reference to FIGS. 5A–5C below.

Figure 5A:
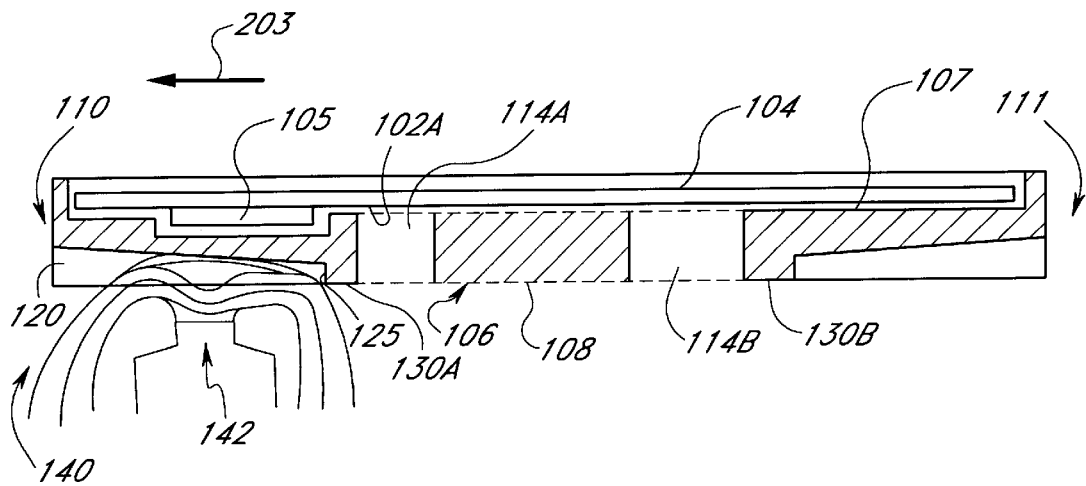
FIGS. 5A–5C are cross-sectional elevational views of the wave solder pallet of FIG. 1A taken along lines 5A—5A of that Figure, which illustrate sequential steps in the function of the wave solder pallet during a wave soldering process.
Figure 5B:
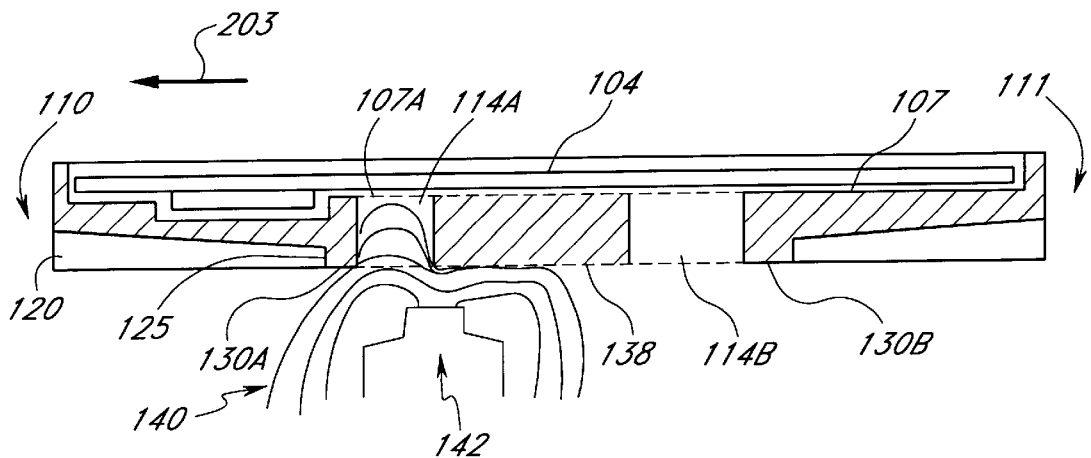
Figure 5C:
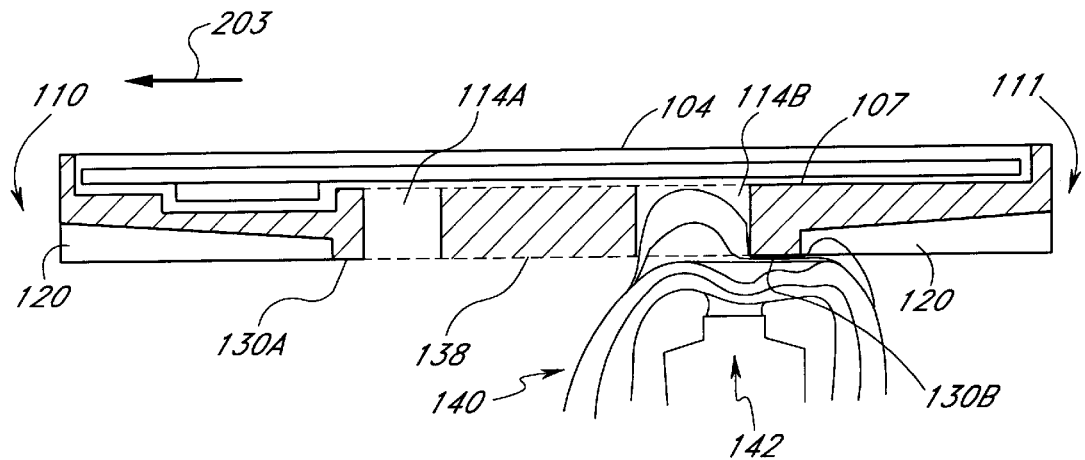

As illustrated in FIGS. 5A–5C, during an exemplary soldering process, the circuit board 104 is positioned adjacent the solder pallet 100 so that the regions 102A–102C are positioned in the apertures 114A–114C, respectively, and the component 105 is positioned in the recess 118. The combined assembly may be passed over a solder wave 140 from a solder nozzle 142 of a wave solder machine (see FIG. 2) in the first direction as depicted by the arrow 203.

As the pallet 100 is passed through the solder wave 140, the solder wave 140 initially contacts the front end 110 of the lower side 108 of the base plate 106 and continues contacting along the lateral X axis of the pallet 100 as shown in FIG. 5A. The solder wave 140 in this embodiment has a constant solder pressure and applies a pressure effect on surfaces upon contact.

This pressure effect increases as the contact surface (e.g., the channel ceiling 128 or the base plate segments 130A–130D) becomes closer to the wave 140. Since the channel 120 is wider and deeper at the front end 110 adjacent the peripheral wall 109 of the base plate 106, the pressure effect of the solder wave 140 on the lower side 108 of the base plate 106 is reduced adjacent the peripheral wall 109. This, in turn, reduces the solder splashing onto the pallet 100 when the solder wave 104 drains the solder back to solder housing 202 (see FIG. 2).

As the wave moves towards the end wall 125 of the channel 120, as shown in FIG. 5A, draining of the solder continues but the pressure of the solder contacting the bottom of the plate 106 gradually increases as the channel 120 gets shorter and narrower. This increase in the contacting pressure may be caused by both the narrowing of the channels 120 and the increasing area of the flat surface of the lower side 108 of base plate 106 that the wave 140 contacts. Accordingly, when the solder wave 140 arrives at the base plate segments 130A and 130C and before the selected areas 102A and 102C are exposed to the solder wave 140 through the apertures 114A and 114C, the pressure effect becomes instantaneously higher.

As shown in FIG. 5B, the selected area 102A receives solder from the solder wave 140. As a result of high pressure effect created by the base plate segments 130A–130D and the tapering of the channel 120, the selected area 102A receives a higher pressure solder flow to achieve desired soldering treatment. Similarly, as shown in FIG. 5C, as a result of high pressure effect created at the intermediate base plate segment 138, the selected area 114B also receives a higher pressure solder flow to achieve desired soldering treatment. As the wave 140 reaches the rearward end 111 of the base plate 106, channels 120 reduce the pressure effect and reduce splashing in the manner explained above.

In particular, the base plate segments 130A–130D decrease the distance that the solder wave 140 travels just prior to the solder wave 140 entering the apertures 114A–114C. When the pallet 100 is located so that the solder wave 140 is entering the apertures 114A–114C, such as is shown in FIGS. 5B and 5C, a portion of the solder wave 140 is contacting the corresponding base plate segments 130A–130D which confines this portion of the solder wave 140 in a smaller space thereby increasing the overall pressure of this portion of the solder wave 140. Due to the viscous nature of the solder wave 140, the increase in pressure is transmitted to the portion of the solder wave 140 that is entering the apertures 114A–114C, thereby forcing the portion of the solder wave 140 through the apertures 114A–114C with greater force.

Moreover, since the base plate segments 130A–130D are coplanar with the bottom openings of the apertures 114A–114C, the base plate segments 130A–130D result in the bottom opening of the apertures 114A–114C being positioned closer to the nozzle 142. Consequently, the solder particles comprising the portion of the solder wave 140 that enters the apertures 114A–114C are travelling at a greater velocity and are more coherently channeled into the aperture 114A–114C, further increasing the pressure of the portion of the solder wave 140 that is entering into the apertures 114A–114C.

It is understood that the solder pallet 100 of this embodiment allows solder to be transmitted through to selected regions on the printed circuit board 104 via apertures 114A–114C, with an increased pressure while minimizing the occurrence of undesirable solder splash during a wave solder process. This is achieved by means of non-conducting channels 120 formed at the lower side 108 of the pallet. These channels 120 are tapered inwardly and extend from the outer periphery of the pallet 100 to the base plate segments which are interposed between the inner ends of the channels and the apertures 114A–114C. Because of the tapering, the overall volume of the channel 120 is greatest at the periphery of the pallet. The increased volume of the channel 120 reduces the pressure effect of the solder wave 100 as it contacts the pallet 100 at the periphery thereby reducing the amount of solder that is splashed over the pallet 100. The tapering of the channel uniformly increases the pressure so that the pressure effect of the solder wave when it travels through the apertures is increased. At base plate segments 130A–130D, the surface of the pallet 100 is closer to the solder wave 140 so as to instantaneously increase the pressure effect of the solder wave 140 so that the selected areas in the apertures receive a high pressure solder flow resulting in better solder coverage.

Although the invention has been described in terms of certain embodiments, other embodiments will become apparent to those of ordinary skill in the art, in view of the disclosure herein. Accordingly, the invention is not intended to be limited by the recitation of preferred embodiments, but is instead intended to be defined by reference to the appended claims.

What is claimed is:

1. A wave solder pallet for wave soldering an area of a printed circuit board, the pallet comprising a base plate having a first and a second side wherein said base plate is adapted to receive a printed circuit board on said first side and wherein said base plate has at least one aperture extending from said first side to the second side so as to allow a solder from a wave solder system to flow through said aperture and contact a selected region of the printed circuit board when said base plate is drawn across the solder wave in a first direction, said base plate also having at least one channel that extends from an outer periphery of said base plate in said first direction towards an inner end located adjacent said aperture, wherein the volume of said channel at said outer periphery is greater than the volume of said channel at said inner end.

2. The wave solder pallet of claim 1, wherein said channel is adapted so that when the solder wave contacts the base plate at a substantially constant solder pressure, the pressure effect of the solder wave on said outer periphery of said base plate is less than the pressure effect of the solder wave on said inner end of the base plate.

3. The wave solder pallet of claim 1, wherein said channel has an inner surface located at a first depth from said second side of the base plate and said pressure increasing surface is located at a second depth from said second side, wherein said second depth is less than said first depth.

4. The wave solder pallet of claim 3, wherein said channel has an inner surface located at a first depth from said second side and wherein said pressure increasing surface is coplanar with said second side of said base plate.

5. The wave solder pallet of claim 1, wherein said channel has two side walls that are uniformly tapered inwardly from said outer periphery towards said inner end of the channel so that the pressure of the solder wave contacting the base plate is gradually increased as said wave solder pallet is moved in said first direction.

6. The wave solder pallet of claim 1, wherein the wave solder pallet includes one or more recesses formed on said first side of the wave solder pallet that are adapted to receive one or more components positioned on the printed circuit board.

7. A wave solder pallet for wave soldering an area of a printed circuit board, said pallet comprising a base plate having a first and a second side wherein said base plate is adapted to receive a printed circuit board on said first side and wherein said base plate has at least one aperture extending from said first side to said second side so as to allow solder from a wave solder system to flow through said aperture and contact a selected region of the printed circuit board when said base plate is drawn across a solder wave in a first direction, said base plate also having at least one channel that extends from an outer periphery of said base plate in the first direction towards an inner end located adjacent said aperture wherein said channel extends towards said aperture in said base plate a first distance and wherein said base plate has a pressure increasing surface interposed between said inner end of said channel and said aperture so that as said base plate is moved in the first direction with respect to the solder wave, the pressure produced in the channel by the portion of the solder wave entering the aperture is increased as a result of a portion of the solder wave contacting said pressure increasing surfaces of said base plate.

8. The wave solder pallet of claim 7, wherein the volume of said channel at said outer periphery is greater than the volume of said channel at said inner end so that the pressure produced by the solder wave at said outer periphery of said base plate is less than the pressure produced by the solder wave at said inner end.

9. A solder pallet for use in a process of wave soldering a circuit board, the pallet having a first and a second side with at least one aperture extending from the first to the second side, wherein the first side is adapted to receive a printed circuit board and wherein the second side has a channel formed therein which extends from the periphery of the pallet towards the aperture and wherein the second side further has a pressure increasing surface positioned so as to be interposed between the channel and the aperture wherein movement of the pallet relative to the solder wave causes the solder wave to initially contact the channel at a first pressure wherein the first pressure is low enough to substantially eliminate solder splashing around the pallet wherein continued movement of the pallet relative to the solder wave further causes the solder wave to contact the pressure increasing surface at a second pressure wherein the second pressure is higher than the first pressure wherein the second pressure directs a portion of the solder wave simultaneously into the aperture.

10. The solder pallet of claim 9, wherein the channel has a cross-sectional area that is greater adjacent the periphery than it is adjacent the pressure increasing surface, and wherein the cross-sectional area of the channel uniformly decreases over the length of the channel from the periphery to the pressure increasing surface.

11. The solder pallet of claim 10, wherein the pressure increasing surface is coplanar with the second side of the pallet.

* * * * *

UNITED STATES PATENT AND TRADEMARK OFFICE
CERTIFICATE OF CORRECTION

PATENT NO.    : 6,145,729
DATED         : November 14, 2000
INVENTOR(S)   : Curtis C. Thompson It is certified that error appears in the above-identified patent and that said Letters Patent is hereby corrected as shown below:

Column 7,
Line 23, after the word "end", please insert -- , wherein said base plate has a pressure increasing surface interposed between said inner end of said channel and said aperture so that as said base plate is moved in the first direction with respect to the solder wave the pressure of the solder wave contacting said base plate is increased prior to the solder wave communicating with said aperture --.

Signed and Sealed this

Eighth Day of January, 2002

*Attest:*

JAMES E. ROGAN
*Attesting Officer*    *Director of the United States Patent and Trademark Office*